United States Patent
Muro et al.

(10) Patent No.: US 9,558,953 B2
(45) Date of Patent: Jan. 31, 2017

(54) ETCHING METHOD, AND METHOD OF PRODUCING SEMICONDUCTOR SUBSTRATE PRODUCT AND SEMICONDUCTOR DEVICE USING THE SAME

(71) Applicant: FUJIFILM Corporation, Minato-ku, Tokyo (JP)

(72) Inventors: Naotsugu Muro, Shizuoka (JP); Tetsuya Kamimura, Shizuoka (JP); Tadashi Inaba, Shizuoka (JP); Takahiro Watanabe, Shizuoka (JP); Kee Young Park, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/593,150

(22) Filed: Jan. 9, 2015

(65) Prior Publication Data
US 2015/0118860 A1  Apr. 30, 2015

Related U.S. Application Data

(63) Continuation of application No. PCT/JP2013/069961, filed on Jul. 17, 2013.

(30) Foreign Application Priority Data

Jul. 20, 2012 (JP) ................. 2012-161913

(51) Int. Cl.
*H01L 21/306* (2006.01)
*H01L 21/02* (2006.01)
(Continued)

(52) U.S. Cl.
CPC ... *H01L 21/30608* (2013.01); *H01L 21/02063* (2013.01); *H01L 21/32134* (2013.01); *H01L 21/31144* (2013.01)

(58) Field of Classification Search
CPC .................... H01L 21/02063; H01L 21/31144; H01L 21/30604; H01L 21/32134; C09K 13/00; C09K 13/06
See application file for complete search history.

(56) References Cited

U.S. PATENT DOCUMENTS 5,965,465 A  10/1999 Rath et al.
2006/0226122 A1* 10/2006 Wojtczak et al. ............... 216/83
(Continued)

FOREIGN PATENT DOCUMENTS

EP  0 711 846 A1  5/1996
EP  2 234 145 A1  9/2010
(Continued)

OTHER PUBLICATIONS

International Search Report of PCT/JP2013/069961 dated Oct. 8, 2013 [PCT/ISA/210].
(Continued)

*Primary Examiner* — Duy Deo
(74) *Attorney, Agent, or Firm* — Sughrue Mion, PLLC

(57) ABSTRACT

An etching method, having the step of applying an etching liquid onto a TiN-containing layer in a semiconductor substrate thereby etching the TiN-containing layer, the etching liquid comprising water, and a basic compound and an oxidizing agent in water thereof to be within the range of pH from 8.5 to 14, and the TiN-containing layer having a surface oxygen content from 0.1 mol % to 10 mol %.

26 Claims, 1 Drawing Sheet

(51) Int. Cl.
  *H01L 21/3213* (2006.01)
  *H01L 21/311* (2006.01)

(56) References Cited

U.S. PATENT DOCUMENTS

2010/0203731 A1    8/2010  Kong et al.
2013/0035272 A1*   2/2013  Lee et al. ..................... 510/176

FOREIGN PATENT DOCUMENTS

| | | |
|---|---|---|
| JP | 03-064473 A | 3/1991 |
| JP | 5-121378 A | 5/1993 |
| JP | 9-162367 A | 6/1997 |
| JP | 2006-093453 A | 4/2006 |
| JP | 2008-285508 A | 11/2008 |
| JP | 2009-194028 A | 8/2009 |
| JP | 2010-010273 A | 1/2010 |
| JP | 2013-033942 A | 2/2013 |
| WO | 2006/110279 A1 | 10/2006 |
| WO | 2007/044446 A1 | 4/2007 |

OTHER PUBLICATIONS

Communication dated Jan. 28, 2016, issued by the European Patent Office in corresponding European Application No. 13819989.8.
Communication dated Sep. 15, 2015 from the Japanese Patent Office issued in corresponding Japanese application No. 2013-148511.

* cited by examiner

ETCHING METHOD, AND METHOD OF PRODUCING SEMICONDUCTOR SUBSTRATE PRODUCT AND SEMICONDUCTOR DEVICE USING THE SAME

CROSS-REFERENCE TO RELATED APPLICATIONS

This application is a Continuation of PCT International Application No. PCT/JP2013/069961 filed on Jul. 17, 2013, which claims priority under 35 U.S.C. §119 (a) to Japanese Patent Application No. 2012-161913 filed on Jul. 20, 2012. Each of the above applications is hereby expressly incorporated by reference, in its entirety, into the present application.

TECHNICAL FIELD

The present invention relates to a method of etching a semiconductor substrate, and a method of producing a semiconductor substrate product and a semiconductor device using the same.

BACKGROUND ART

The miniaturization and diversification of semiconductor devices has progressed more and more, and a processing method thereof covers a wide range with respect to each of device structures and production steps. With regard to etching of a substrate, for example, a variety of chemical species, processing conditions and the like has been proposed in accordance with kinds and structures of the substrate material in both a dry etching and a wet etching, and further intensive research and development is in progress.

In particular, when a device structure of CMOS, DRAM, and the like is produced, the technique of precisely etching a prescribed material is important, and as an example thereof, a wet etching which uses a chemical liquid is exemplified. For example, a precise etching processing is required in the production of circuit wiring of a microscopic transistor circuit, a metal electrode material, or a substrate having a barrier layer, a hard mask, and the like. However, etching conditions and chemical liquids, which are applied to a substrate having a variety of metal compounds, have not yet been studied sufficiently.

There are examples of studies on chemical liquids for etching titanium nitride (TiN) applied to a device substrate. For example, Patent Literature 1 discloses a processing liquid which has pH of 6.0 to 8.2 and into which both tetraalkyl ammonium hydroxide and hydrogen peroxide are incorporated.

CITATION LIST

Patent Literature

Patent Literature 1: JP-A-2010-010273 ("JP-A" means unexamined published Japanese patent application)

DISCLOSURE OF INVENTION

Technical Problem

The inventors have investigated a chemical liquid that enables etching of a layer containing TiN (hereinafter, may be referred to as "TiN-containing layer"), and an etching method using the same. The inventors have thus proceeded with their studies on the newly-developed etching liquid described above, and then found that a different substrate results in a different etching state of the TiN-containing layer.

Therefore, the present invention addresses to the provision of an etching method, even when the physical properties and the like of semiconductor substrates are considerably differed among products, which can achieve good etching performance without variation. Further, the present invention addresses to the provision of a production method of a semiconductor substrate product and a semiconductor device using the etching method. Specifically, the present invention addresses to the provision of an etching method, which stably achieves good in-plane etching uniformity and etching rate, even among substrate products each of which has a TiN-containing layer having a different atomic composition (oxygen concentration) from one another. Further, the present invention addresses to the provision of a method of producing a semiconductor substrate product and a semiconductor device using the etching method.

Solution to Problem

According to the present invention, there is provided the following means:

{1} An etching method, having the step of:
preparing an etching liquid having water, a basic compound, and an oxidizing agent, the etching liquid being in the range of pH from 8.5 to 14,
applying the etching liquid onto a TiN-containing layer in a semiconductor substrate thereby etching the TiN-containing layer, the TiN-containing layer having a surface oxygen content from 0.1 mol % to 10 mol %.

{2} The etching method according to item {1}, wherein the basic compound is a compound represented by formula (I):

$$N(R)_4 \cdot OH \qquad \text{Formula (I)}$$

wherein R represents a substituent; and a plurality of Rs may be the same or different from each other.

{3} The etching method according to item {1} or {2}, wherein the basic compound is tetramethylammonium hydroxide, tetraethylammonium hydroxide, or tetrapropylammonium hydroxide.

{4} The etching method according to any one of items {1} to {3}, wherein the oxidizing agent is hydrogen peroxide, ammonium persulfate, perboric acid, peracetic acid, periodic acid, perchloric acid, or a combination thereof.

{5} The etching method according to any one of items {1} to {4}, wherein an etching rate ratio of an etching rate (R1) of a first layer to an etching rate (R2) of a second layer (R1/R2) is 30 or more.

{6} The etching method according to any one of items {1} to {5}, wherein the surface oxygen content of the TiN-containing layer is obtained by using etching ESCA thereby measuring a concentration profile of Ti, O, and N in the depth direction of 0 to 30 nm from the surface of the TiN-containing layer, in terms of an average of oxygen content at the depth of 5 to 10 nm thereof.

{7} The etching method according to any one of items {1} to {6}, wherein the etching is conducted at 40° C. or higher.

{8} The etching method according to any one of items {1} to {7}, wherein the etching is conducted by using single wafer type processing equipment.

{9} The etching method according to any one of {1} to {8}, having the steps of:

mixing a first liquid and a second liquid, thereby obtaining the etching liquid; the first liquid having water and a basic compound, the second liquid having water and an oxidizing agent; and applying the etching liquid onto the semiconductor substrate on a timely basis.

{10} The etching method according to any one of items {1} to {9}, wherein the etching liquid has a water-soluble organic solvent.

{11} A method of producing a semiconductor substrate product, having the step of etching the TiN-containing layer of the semiconductor substrate by the etching method according to any one of items {1} to {10}.

{12} A method of producing a semiconductor device, producing the semiconductor device by using the semiconductor substrate product obtained by the production method according to item {11}.

In the present specification, the term "having" is to be construed in the open-ended meaning as well as the term "comprising" or "containing." Further, the term "preparing" is to be construed in the broadest manner as the meaning of making materials ready to be used, e.g., not only the meaning of producing or synthesizing the materials, but also purchasing them.

Advantageous Effects of Invention

According to the etching method of the present invention and the production method of a semiconductor substrate product and a semiconductor device of the present invention, even when the physical properties of the semiconductor substrates are differed among products, good etching performance can be achieved without variation, Specifically, according to the present invention, even among substrates each of which has a TiN-containing layer having a different atomic composition (oxygen concentration) from one another, good in-plane etching uniformity and etching rate can stably be achieved.

Other and further features and advantages of the invention will appear more fully from the following description, appropriately referring to the accompanying drawings.

MODE FOR CARRYING OUT THE INVENTION

Figure 1:
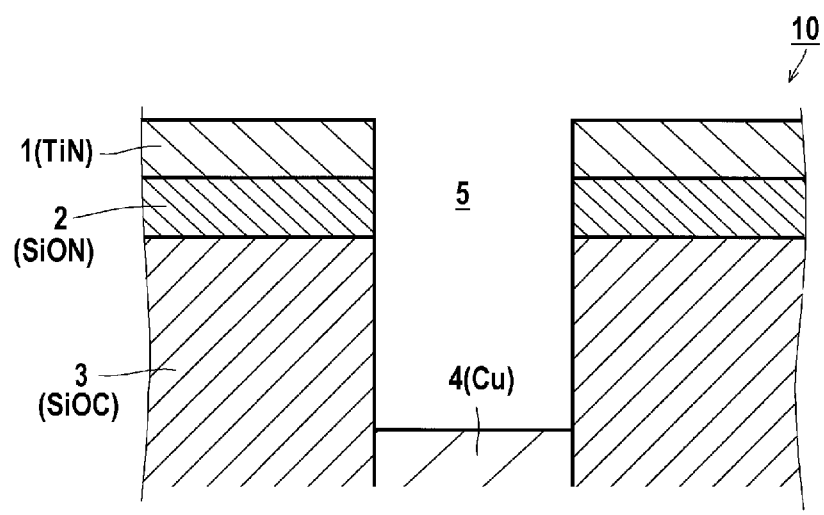
FIG. 1 is a section view diagrammatically showing an example of a production step of a semiconductor substrate (before etching) according to one embodiment of the present invention.
Figure 2:
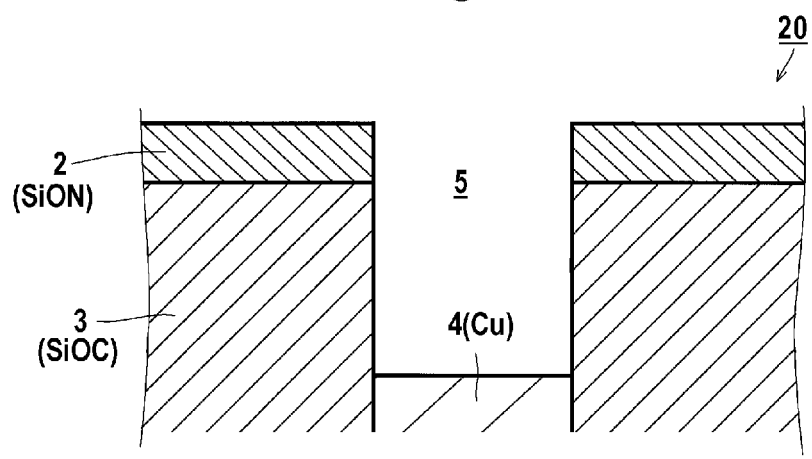
FIG. 2 is a section view diagrammatically showing an example of a production step of a semiconductor substrate (after etching) according to one embodiment of the present invention.

First, preferable embodiments of the etching step concerning the etching method of the present invention are explained on the basis of FIG. 1 and FIG. 2.
{Etching Process}

FIG. 1 is a view showing a semiconductor substrate before etching. In the production example of the present embodiment, a layered product is used, in which SiOC-containing layer 3 and SiON-containing layer 2 as a specific second layer are disposed on a silicon wafer (not shown) and TiN-containing layer 1 is formed on the second layer. At this moment, Via 5 has been already formed in the above-described composite layer, and Cu-containing layer 4 has been formed at the bottom of the Via 5. Onto Substrate 10 at this state, an etching liquid (not shown) according to the present embodiment is applied to remove the TiN-containing layer. The above-described etching liquid preferably has removability and washability of a residue that is produced by plasma etching, ashing, and the like whereby the residue (not shown) also can be effectively removed. As a result, Substrate 20 having a configuration in which the TiN-containing layer has been removed as shown in FIG. 2 can be obtained. Needless to say, although the etching and washing state as graphically shown is ideal to the present invention and a preferable embodiment thereof, a remainder of the TiN-containing layer or the residue or alternatively some corrosion of the second layer is appropriately acceptable according to a required quality of a semiconductor device to be produced and the like and, therefore, the present invention is not construed to a limited extent by the above description.

Note that the term "silicon substrate" or "semiconductor substrate" is used in the sense of including not only a silicon wafer, but also a whole extent of the substrate structure having thereon a circuit structure. The term "element of a substrate" refers to an element that constitutes the silicon substrate that is defined above, and may be made of a single material or a plurality of materials. A processed semiconductor substrate is sometimes called as a semiconductor substrate product by a distinction. A tip or a processed product thereof, which has been obtained by further processing the semiconductor substrate product, if needed, and then by singulating the same is referred to as semiconductor device or semiconductor equipment. With respect to the direction of the semiconductor, in reference to FIG. 1, the opposite side to the silicon wafer (TiN side) is called as "upper", or "head edge", while the silicon wafer side (SiOC side) is called as "under", or "bottom".
(Etching Liquid)

Next, a preferable embodiment of the etching liquid in the present invention is explained. The etching liquid of the present embodiment contains a specific oxidizing agent and a basic compound. Hereinafter, each of components including optional ones is explained.
(Oxidizing Agent)

Examples of the oxidizing agent include hydrogen peroxide, ammonium persulfate, perboric acid, peracetic acid, periodic acid, perchloric acid, or a combination thereof. Among them, hydrogen peroxide is particularly preferable.

It is preferable for the oxidizing agent to be contained in a range of at least 0.5% by mass, more preferably in a range of at least 1% by mass, and still more preferably in a range of at least 2% by mass, with respect to the total amount of the etching liquid of the present embodiment. On the other hand, the upper limit thereof is preferably equal to or less than 20% by mass, and more preferably equal to or less than 15% by mass, and particularly preferably equal to or less than 10% by mass. By setting the content to the above-described upper limit or less, excessive etching of the second layer can be preferably suppressed more efficiently. It is preferable to set the content to the above-described lower limit or greater from the viewpoint of speed enough for etching the first layer.

The oxidizing agent may be used solely in one kind, or two or more kinds.
(Basic Compound)

The basic compound, although it is not particularly limited as long as it has alkalinity, is preferably an organic basic compound and more preferably an organic amine compound (ammonium compounds are included therein). As the organic amine compound, a compound in which a structure of a primary to tertiary amine or a quaternary ammonium is incorporated is more preferable. Examples of the compound include a primary alkylamine having 1 to 6 carbon atoms which may have substitute T below, a primary aromatic amine having 6 to 12 carbon atoms which may have substitute T below, a secondary amine having 2 to 6 carbon atoms which may have substitute T below (in case of including an aromatic group, the carbon number may be preferable in 7 to 24), a tertiary amine having 3 to 6 carbon atoms which may have substitute T below (in case of including an aromatic group, the carbon number may be preferable in 8 to 24), a quaternary ammonium having 4 to 16 carbon atoms or a salt thereof which may have substitute T below. Further, aminoalcohol (preferably having carbon atoms 1 to 12, including 2-aminoethanol) and guanidine carbonate are exemplified.

The above primary amine, secondary amine, and tertiary amine are respectively preferably represented in following formulae (A-1) to (A-3). R defines the meaning same as that defined in Formula (I).

  NRH$_2$  Formula (A-1)

  NR$_2$H  Formula (A-2)

  NR$_3$  Formula (A-3)

Especially, a basic compound represented by the following Formula (I) is preferable.

  N(R)$_4$.OH  Formula (I)

R represents a substituent. A plurality of Rs may be the same or different from each other. Examples of R include an alkyl group (a straight alkyl group, a cyclic alkyl group, an aralkyl group or the like are included therein), an alkenyl group, an alkynyl group, and a group having an aryl group. Especially, it is preferable for R to be an alkyl group, an alkenyl group, an alkynyl group, or an aryl group. It is more preferable for R to be an alkyl group having 1 to 4 carbon atom(s), an alkenyl group having 2 to 4 carbon atoms, an alkynyl group having 2 to 4 carbon atoms, or an aryl group having 6 to 12 carbon atoms. Herein, the above alkyl group, alkenyl group, alkynyl group, or aryl group may have a substitute T which includes a hydroxyl group, an amino group, a carboxyl group, or a halogen atom (chlorine, fluorine, bromine or the like).

Among the compounds represented by formula (I), tetramethylammonium hydroxide (TMAH), tetraethylammonium hydroxide (TEAH) tetrapropylammonium hydroxide (TPAH), and tetrabuhylammonium hydroxide (TBAH) are preferable.

It is preferable for the basic compound to be contained in a range of at least 0.05% by mass and more preferably in a range of at least 0.5% by mass, with respect to the total amount of the etching liquid of the present embodiment. The upper limit thereof is preferably equal to or less than 30% by mass, more preferably equal to or less than 10% by mass, still more preferably equal to or less than 5% by mass, and particularly preferably equal to or less than 3% by mass. Setting the content of the basic compound at the above-described upper limit or less is preferable from the viewpoint of avoiding a problem resulting from the basic compound itself that inhibits etching of the metal layer. Setting of the content which is equal to or more than the above-described lower limit is preferable from the viewpoint that anticorrosion property to the other substrate such as SiO and SiC is enhanced.

Described about a relation to the oxidizing agent, it is preferable for the basic compound to be used in a range of 0.5 part by mass or greater and more preferably 10 parts by mass or greater, with respect to 100 parts by mass of the oxidizing agent. On the other hand, the upper limit thereof is preferably equal to or less than 50 parts by mass and more preferably equal to or less than 40 parts by mass. By using the amounts of the both parties in an appropriate relation, good etching performance can be realized and high in-plane uniformity of etching can be achieved in combination therewith.

The basic compound may be used solely in one kind, or two or more kinds.

(Aqueous Medium)

The etching liquid of the present invention is preferably an aqueous solution in which water (aqueous medium or water medium) is used as a medium and each of components contained therein is uniformly dissolved. The content of water is preferably from 50 to 99.5% by mass and more preferably from 55 to 95% by mass, with respect to the total mass of the etching liquid. Thus, a composition composed primarily of water (50% by mass or more) is sometimes called as an aqueous composition in particular, and preferable in terms of more inexpensive and more adaptable to the environment, compared to a composition with a high ratio of an organic solvent. The water (aqueous medium) may be an aqueous medium containing components dissolved therein in an amount by which the effects of the present invention are not deteriorated, or may contain inevitable microscopic amount of mixed components. Especially, distilled water or an exchanged water, or water which has been subjected to a purifying process, such as ultrapure water is preferable and the ultrapure water which is used for production of the semiconductor is particularly preferable.

(pH)

In the present invention, the pH of the etching liquid is adjusted to 8.5 or more, preferably 9 or more, more preferably 9.5 or more, and particularly preferably 10 or more. The upper limit thereof is set to 14 or less, preferably 13.5 or less, and more preferably 13 or less. Adjustment to the above-described lower limit or more makes it possible not only to put the etching speed on a par with a practical level, but also to enhance in-plane uniformity. On the other hand, adjustment to the above-described upper limit or less is preferable for anticorrosion property to the other substrate such as SiO and SiC. Note that the pH in the present invention refers to a value obtained in accordance with the equipment and the conditions used for measurement in Examples, unless otherwise indicated.

(Other Component)

pH Controlling Agent

In the present embodiment, the pH of the etching liquid is controlled to be within the above-described range and a pH controlling agent is preferably used for the control thereof. Examples of the pH controlling agent include: in order to increase the pH, a basic compound described in the above-described section of "Basic compound"; in order to decrease the pH, an inorganic acids such as hydrochloric acid, nitric acid, sulfuric acid, and phosphoric acid; and an organic acids such as formic acid, acetic acid, propionic acid, butyric acid, valenic acid, 2-methyl butyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, benzoic acid, glycolic acid, salicylic acid, gliceric acid, oxalic acid, malonic acid, succinic acid, glutaric acid, adipic acid, pimelic acid, maleic acid, phthalic acid, malic acid, oxalic acid, citric acid, and lactic acid.

The use amount of the pH controlling agent is not particularly limited and an amount necessary to control the pH to the above-described range may be used.

The pH controlling agent may be used solely in one kind, or two or more kinds.

In the etching liquid used in the present invention, further a water-soluble organic solvent may be added thereto. The water-soluble organic solvent is preferably an organic solvent that can be mixed with water in an arbitrary proportion. This is effective at capability of improving in-plane uniform etching property of the wafer.

Examples of the water-soluble organic solvent include: alcohol compound solvents, such as methyl alcohol, ethyl alcohol, 1-propyl alcohol, 2-propyl alcohol, 2-butanol, ethylene glycol, propylene glycol, glycerol, 1,6-hexanediol, cyclohexanediol, sorbitol, xylitol, 2-methyl-2,4-pentanediol, 1,3-butanediol, and 1,4-butanediol; ether compound solvents, such as an alkylene glycol alkyl ether including ethylene glycol monomethyl ether, ethylene glycol monobuthyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, and diethylene glycol monobutyl ether.

Among these solvents, preferred are alcohol compound solvents having 2 to 15 carbon atoms and alcohol and/or ether compound solvents having 2 to 15 carbon atoms. More preferred are alcohol compound solvents having 2 to 10 carbon atoms and at least 2 hydroxyl groups and ether compound solvents having 2 to 10 carbon atoms and at least 2 hydroxyl groups. Especially preferred are alkyleneglycol alkylethers having 3 to 8 carbon atoms. The water-soluble organic solvent may be used singly or appropriately in combination of two or more kinds. In the present specification, a compound having a hydroxyl group (—OH) and an ether group (—O—) in the molecule thereof shall be included in the category of the ether compound in principle (not called as the alcohol compound). When a compound having both a hydroxyl group and an ether group is mentioned in particular, the compound may be preferably called as "hydroxyl group-containing ether compound".

The water-soluble organic solvent can preferably be the compounds represented in following formula (O-1).

$$R^{11}-(-O-R^{13}-)_n-O-R^{12} \qquad (O\text{-}1)$$

$R^{11}$ and $R^{12}$ are, respectively and dependently, a hydrogen atom or an alkyl group having carbon number of 1 to 5. $R^{13}$ is liner or branched alkylene group having carbon number of 1 to 4. A plurality of $R^{13}$ can be respectively differed. n is integer of 1 to 6.

Especially among these compounds, propyleneglycol and dipropyleneglycol are preferable. The addition amount thereof is preferably from 0.1 to 70% by mass and more preferably from 10 to 50% by mass, with respect to the total mass of the etching liquid. By setting the addition amount to the above-described lower limit or greater, improvement in uniformity of the above-described etching can be effectively realized.

The water-soluble organic solvent may be used solely in one kind, or two or more kinds.

{Kit}

The etching liquid in the present invention may be constituted as a kit in which the raw materials thereof are divided into multiple parts. Examples of the kit include an embodiment in which, as a first liquid, a liquid composition in which the above-described basic compound is contained in a water medium is prepared, and, as a second liquid, a liquid composition in which the above-described oxidizing agent is contained in a water medium is prepared. As an example of the use thereof, preferred is an embodiment in which both liquids are mixed to prepare an etching liquid, and after that, the etching liquid is applied to the above-described etching process on a timely basis. This avoids it from raising deterioration of the liquid properties due to decomposition of the oxidizing agent (for example, hydrogen peroxide) whereby a desired etching function can be effectively exhibited. Herein, the terms "on a timely basis (timely)" after mixing defines the meaning of a period of time prior to a desired function being lost after mixing. Specifically, the period of time is preferably within 60 minutes, more preferably within 30 minutes, and particularly preferably within 10 minutes.

The concentration of the basic compound in a first liquid, although it is not particularly limited, is preferably 0.5% by mass or more and more preferably 1.5% by mass or more. The upper limit thereof is preferably 4% by mass or less and more preferably 3% by mass or less. By setting the concentration to the above-described range, a condition suitable for mixing with a second liquid can be achieved and a favorable concentration region in the above-described etching liquid can be preferably achieved.

The concentration of the oxidizing agent in a second liquid, although it is not particularly limited, is preferably 15% by mass or more and more preferably 25% by mass or more. The upper limit thereof is preferably 45% by mass or less and more preferably 35% by mass or less. By setting the concentration to the above-described range, a condition suitable for mixing with a first liquid can be achieved and a favorable concentration region in the above-described etching liquid can be preferably achieved.

In the case where the above-described water-soluble organic solvent is used, it is preferable that the water-soluble organic solvent is preliminarily added to the first liquid side. Alternatively, a liquid composition in which a water-soluble organic solvent has been added to a water medium is preliminarily prepared and the liquid composition may be mixed as a third liquid with the first liquid and the second liquid.

The methodology for mixing a first liquid with a second liquid, although it is not limited, is preferably a method of putting the first liquid and the second liquid into circulation in a separate flow channel and joining them at the injunction portion of the flow channels, thereby mixing them. After that, it is preferable that the etching liquid obtained by interflow is further put into circulation in a flow channel and then ejected or sprayed from a discharge opening, thereby bringing it contact with a semiconductor substrate. In this embodiment, a step of from interflow-mixing at the injunction portion to contact with the semiconductor substrate is preferably conducted "on a timely basis (timely)" described above.

For the anticorrosion property to SiO and SiC, it is preferable that a complex compound such as ethylenediamine tetraacetic acid (EDTA) is not used in the etching liquid in the present invention. From the above-described viewpoint, it is preferable that the etching liquid in the present invention is composed substantially of the above-described basic compound, oxidizing agent, and water medium as components thereof, or is composed substantially of the above-described basic compound, oxidizing agent, water-soluble organic solvent, and water medium as components thereof. Herein, the term "substantially" means that the etching liquid may contain components such as inevitable impurities to an extent of which the present invention exerts a desirable effect.

{Condition of Etching}

In the present embodiment, the conditions for etching are not particularly limited. Either single wafer type (spray-type) etching or immersion type (batch type) etching may be applicable. Among them, it is particularly preferable to use the single wafer type etching equipment, in view of achieving good in-plane uniformity of etching that is the advantageous aspect brought about by the present invention. In spray-type etching, a semiconductor substrate is transported or rotated in the prescribed direction and to spray an etching liquid into the space, thereby bringing the etching liquid into contact with the semiconductor substrate. On the other hand, in batch-type etching, a semiconductor substrate is immersed in a liquid bath constituted of an etching liquid, thereby bringing the etching liquid into contact with the semiconductor substrate in the liquid bath. These etching processes may be appropriately used depending on the structure, the material, and the like of a device.

The processing temperature at which etching is conducted is preferably equal to or greater than 40° C., more preferably equal to or greater than 50° C., and particularly preferably equal to or greater than 55° C., in the measurement method of temperature in Examples below. The upper limit thereof is preferably equal to or less than 80° C., and more preferably equal to or less than 70° C. By controlling the temperature to the above-described lower limit or greater, a sufficient etching rate with respect to the Ti-containing layer can be preferably secured. By setting the temperature to the above-described upper limit or less, stability with age of the etching rate can be preferably maintained. The feeding rate of the etching liquid, although it is not particularly limited, is preferably set within the range from 0.05 to 2 L/min and more preferably from 0.1 to 1.5 L/min. By controlling the feeding rate to the above-described lower limit or greater, in-plane uniformity of etching can be preferably secured at more excellent level. By controlling the feeding rate to the above-described upper limit or lower, stable selectivity at the time of continuous processing can be preferably secured. When a semiconductor substrate is rotated, it is preferable to rotate the semiconductor substrate at the range from 50 to 800 rpm, more preferably 200 to 600 rpm, from the same viewpoint as the above, although it may vary depending on the size or the like of the semiconductor substrate.

In the case of the batch type, it is also preferable to control the liquid bath to the above-described temperature range from the same reason as the above. The immersing time of the semiconductor substrate, although it is not particularly limited, is preferably set so as to be from 0.5 to 30 minutes and more preferably from 1 to 10 minute(s). By setting the temperature to the above-described lower limit or greater, in-plane uniformity of etching can be preferably secured. By setting the temperature to the above-described upper limit or less, the performance in the case of re-using an etching liquid can be preferably maintained.

{Residue}

The production process of the semiconductor device may include a step of etching a metal layer or the like on a semiconductor substrate by a plasma etching technique using a resist pattern or the like as a mask. Specifically, etching of the metal layer, a semiconductor layer, an insulating layer, and the like is conducted, thereby patterning the metal layer and the semiconductor layer, or forming, on the insulating layer, an opening portion such as a via hale and a wiring groove. In the plasma etching, a residue derived from the resist used as a mask, and the metal layer, the semiconductor layer, and the insulating layer to be etched is formed on the semiconductor substrate. In the present invention, the residue formed by the plasma etching as described above is called as a "plasma etching residue". The "plasma etching residue" includes an etching residue derived from the above-described second layer (SiON, SiOC, and the like).

Further, the resist pattern used as a mask is removed after etching. In order to remove the resist pattern, as described above, a wet method using a stripper liquid, or a dry method in which ashing is conducted using, for example, plasma or ozone, is used. In the ashing, an altered residue of the plasma etching residue formed by the plasma etching and a residue derived from the resist to be removed are formed on the semiconductor substrate. In the present invention, the residue formed by the ashing as described above is called as an "ashing residue". Further, as the general term for the residual matter which is formed on the semiconductor substrate and should be removed by washing, such as the plasma etching residue and the ashing residue, they may be simply called as a "residue".

The plasma etching residue and the ashing residue which are the residue after such etching (Post Etch Residue) are preferably washed and removed using a washing composition. The etching liquid according to the present embodiment can be also used as a washing liquid for removing the plasma etching residue and/or the ashing residue. Especially, the etching liquid is preferably used to remove both the plasma etching residue and the ashing residue after the plasma ashing which is conducted in succession to the plasma etching.

{Material to be Processed}

A material, which is etched by applying thereto the etching liquid according to the present embodiment, may be arbitrarily used. However, the etching liquid can be applied to a semiconductor substrate having a first layer containing TiN. Herein, the term "layer containing TiN (TiN-containing layer)" means that the layer may contain oxygen. When the TiN-containing layer is especially used to distinguish it from a layer which does not contain oxygen, it may be called as a TiON-containing layer or the like. In the present invention, the oxygen content of the TiN-containing layer is equal to or less than 10% by mole, preferably equal to or less than 8.5% by mole and more preferably equal to or less than 6.5% by mole. The lower limit thereof is equal to or greater than 0.1% by mole, preferably equal to or greater than 2.0% by mole and more preferably equal to or greater than 4.0% by mole. By setting the oxygen concentration to the above-described range of from the lower limit to the upper limit and by combining it with the specific etching liquid described above, stable etching performance to the TiN-containing layer can be realized, even between different substrates from one another, as demonstrated in Examples described below. Such adjustment of the oxygen concentration in the TiN-containing layer in the substrate can be conducted by, for example, adjustment of the oxygen concentration in a processing room for CVD (Chemical Vapor Deposition) at the time of forming the TiN-containing layer.

The above-described first layer is preferably subjected to etching at high etching rate. The thickness of the first layer is not particularly limited. However, when compositions of ordinary devices are considered, it is practical that the thickness is approximately from 0.005 to 0.3 µm. The etching rate (R1) of the first layer is not particularly limited. However, considering production efficiency, the etching rate is preferably from 50 to 500 Å/min.

The method of the present invention is preferably applied to a semiconductor substrate having a second layer containing at least one of Cu, SiO, SiN, SiOC and SiON. Note that in the present specification, when the composition of a metal compound is expressed by a combination of elements thereof, the composition means that compositions having arbitrary percentage of the elements are incorporated in a broad sense. For example, SiO means that it incorporates a thermally-oxidized film of silicon and $SiO_2$, and includes $SiO_x$. It is preferable for the second layer to be kept at a low etching rate. The thickness of the second layer is not particularly limited. However, when compositions of ordinary devices are considered, it is practical that the thickness is approximately from 0.005 to 0.5 µm. The etching rate (R2) of the second layer is not particularly limited. However, considering production efficiency, the etching rate (R2) is preferably controlled to be within the range from 0.001 to 10 Å/min.

In the selective etching of the first layer, its etching rate ratio {(R1)/(R2)} is not particularly limited. However, when described based on the premise of a device that needs a high selectivity, the etching rate ratio is preferably equal to or greater than 50. In the definition of the range, the etching rate ratio is preferably from 10 to 5,000, more preferably from 30 to 3,000, and particularly preferably from 50 to 2,500.

{Production of Semiconductor Substrate Product}

In the present embodiment, a semiconductor substrate product having a desired structure is preferably produced through a step of providing a semiconductor substrate by forming the above-described first layer and second layer on a silicon wafer and a step of applying the etching liquid onto the semiconductor substrate thereby selectively dissolving the first layer. At this moment, the above-described specific etching liquid is used for etching. It is preferable that prior to the above-described etching step, the semiconductor substrate is subjected to a dry etching or dry ashing step and a residue formed in the step is removed.

EXAMPLES

The present invention will be described in more detail based on examples given below, but the invention is not meant to be limited by these.

Example 1 and Comparative Example 1

Etching liquids were prepared to contain components shown in the following Table 1 in accordance with the compositions (% by mass) shown in the same table.

(Method of Preparing a TiN Substrate)

A TiN-containing layer having a surface oxygen concentration of less than 0.1% by mole was formed on a commercially available silicon substrate by CVD (Chemical Vapor Deposition). The thus-obtained substrate was designated as Test substrate 9. Further, Substrates 1 to 6 each of which has a different surface oxygen concentration from one another and Substrates 7 and 8 each of which has a different diameter thereof from one another were prepared by controlling a microscopic amount of oxygen concentration in the gas phase at the time of CVD. Further, as Substrate 10, a commercially available TiN substrate (manufactured by Silicon Valley microelectronics) was used without any change.

<Etching Test>

Test wafer: a semiconductor substrate (specimen) was prepared, in which a TiN-containing layer was disposed on a silicon wafer. Using single wafer type equipment (POLOS (trade name) manufactured by SPS-Europe B.V. Corporation), this specimen was subjected to etching under the following conditions, and evaluation test was conducted.

Treatment temperature: 57° C.
Discharge rate: 1 L/min.
Wafer rotation number: 500 rpm {Measuring Method of Treatment Temperature}

A radiation thermometer IT-550F manufactured by HORIBA, Ltd. was fixed at the height of 30 cm above the wafer in the single wafer type equipment. The thermometer was pointed at the wafer surface of 2 cm outside of the wafer center, and temperature measurement was conducted while circulating a chemical liquid. The temperature was measured by digital output from the radiation thermometer and continuously recorded on a personal computer. Among them, an averaged value of the temperature during the period of 10 seconds after stability of the temperature was used as a temperature on the wafer.

(Evaluation of In-Plane Uniformity of Etching)

Condition setting required for the etching depth at the center of a circular substrate was conducted at different time periods whereby the time period required to arrive at 300 Å of the etching depth was confirmed. Next, the entire substrate was subjected to etching again at the confirmed time period, and subsequently measurement of the etching depth was conducted at the centrally-directed position of 30 mm from the periphery of the substrate. Evaluation was conducted on the condition that the near 300 Å the depth was, the higher the in-plane uniformity of etching was. Specific criteria are as follows.

| AAA | ±5 Å or less |
|---|---|
| AA | ±more than 5 Å and 12 Å or less |
| A | ±more than 12 Å and 15 Å or less |
| B | ±more than 15 Å and 20 Å or less |
| C | ±more than 20 Å and 30 Å or less |
| D | ±more than 30 Å and 50 Å or less |
| E | ±more than 50 Å |

The in-plane uniformity may not be questioned, when a substrate can be treated with taking a sufficient time. However, in the semiconductor industry, it is highly required to treat a substrate in a limited duration, and hence it is demanded to realize etching performance in a prompt manner with uniformity. In other words, taking too much time, another layer not to be removed may gradually be dissolved, or the other problems may occur, consequently the another layer possibly being damaged. Accordingly, from the point of view of the quality, the duration of etching may preferably be short (e.g. one to two minutes). Thus, it is important to realize etching uniformity without residue on the surface of the etched material.

(Substrate Oxygen Concentration)

Regarding a surface oxygen concentration of the TiN-containing layer, a concentration profile of Ti, O and N in the depth direction from 0 to 30 nm was measured using etching ESCA (Quantera manufactured by ULVAC-PHI, INCORPORATED) and each of the contents at the depth of from 5 to 10 nm was calculated. An average of the oxygen contents was defined as the surface oxygen concentration.

(Measurement of pH)

The pH in Table is a value obtained by measurement at room temperature (25° C.) using F-51 (trade name) manufactured by HORIBA, Ltd.

(Etching Rate)

Evaluation of the etching rate (ER) was conducted in accordance with the following criteria.

| | |
|---|---|
| A | 300 Å/min or more |
| B | 200 Å/min or more and less than 300 Å/min |
| C | 100 Å/min or more and less than 200 Å/min |
| D | 50 Å/min or more and less than 100 Å/min |
| E | less than 50 Å/min |

ER evaluated as the criterion D causes problem in practice in etching.

ER evaluated as the criterion E cannot practically used for etching.

TABLE 1

| Test | Chemical liquid No. | H$_2$O$_2$ (mass %) | TMAH (mass %) | WSOS (mass %) | Water | pH | Substrate No. | Concentration of oxygen (mol %) | Diameter (inch) | In-plane uniformity of etching | ER |
|---|---|---|---|---|---|---|---|---|---|---|---|
| 101 | 1 | 5 | 1 | DPG 30 | Remaining part | 13 | 1 | 0.1 | 6 | C | B |
| 102 | 1 | 5 | 1 | DPG 30 | Remaining part | 13 | 2 | 2.1 | 6 | B | B |
| 103 | 1 | 5 | 1 | DPG 30 | Remaining part | 13 | 3 | 4.1 | 6 | A | B |
| 104 | 1 | 5 | 1 | DPG 30 | Remaining part | 13 | 4 | 5.9 | 6 | AA | B |
| 105 | 1 | 5 | 1 | DPG 30 | Remaining part | 13 | 5 | 8.2 | 6 | B | B |
| 106 | 1 | 5 | 1 | DPG 30 | Remaining part | 13 | 6 | 9.9 | 6 | C | B |
| 201 | 1 | 5 | 1 | DPG 30 | Remaining part | 13 | 7 | 5.9 | 8 | AAA | B |
| 202 | 1 | 5 | 1 | DPG 30 | Remaining part | 13 | 8 | 5.9 | 12 | AAA | B |
| 203 | 2 | 10 | 1 | DPG 30 | Remaining part | 10 | 7 | 5.9 | 8 | AA | B |
| 204 | 3 | 12 | 1 | DPG 30 | Remaining part | 9 | 7 | 5.9 | 8 | B | B |
| 301 | 4 | 5 | 1 | PG 30 | Remaining part | 13 | 3 | 4.1 | 6 | B | B |
| 302 | 5 | 5 | 1 | EG 30 | Remaining part | 13 | 3 | 4.1 | 6 | B | B |
| 401 | 6 | 5 | 1 | EGME 30 | Remaining part | 13 | 3 | 4.1 | 6 | A | B |
| 402 | 7 | 5 | 1 | EGBE 30 | Remaining part | 13 | 3 | 4.1 | 6 | A | B |
| 403 | 8 | 5 | 1 | PGM 30 | Remaining part | 13 | 3 | 4.1 | 6 | A | B |
| 501 | 9 | 5 | 1 | — | Remaining part | 13 | 3 | 4.1 | 6 | B | B |
| C01 | 1 | 5 | 1 | DPG 30 | Remaining part | 13 | 9 | Less than 0.1 | 6 | D | E |
| C02 | 1 | 5 | 1 | DPG 30 | Remaining part | 13 | 10 | 12.2 | 6 | D | B |
| C03 | 6 | None | 1 | DPG 30 | Remaining part | 14 | 7 | 5.9 | 6 | D | E |
| C04 | 7 | 5 | 0.01 | DPG 30 | Remaining part | 7.5 | 8 | 5.9 | 6 | D | E |

(Notes in Table 1)
Test No.: C01 to C04 are comparative examples.
TMAH: tetramethylammonium hydroxide
DPG: dipropylene glycol
PG: propylene glycol
PGM: propyleneglycol monomethyl ether
EG: ethylene glycol
EGME: ethylene glycol monomethyl ether
EGBE: ethylene glycol monobutyl ether
WSOS: Water Soluble Organic Solvent
Oxygen concentration: oxygen concentration of a TiN-containing layer of a substrate
ER: etching rate From the above-shown results, it is seen that by the combination of the oxygen concentration of the TiN-containing layer between semiconductor substrates and the formula of the etching liquid according to the present invention, a good etching performance without variation in the performance between the substrates is achieved. Specifically, both good in-plane etching uniformity and etching rate are achieved among substrates each of which has a TiN-containing layer with different oxygen concentration. Further, it is seen that among the substrates each of which has the same oxygen concentration, the etching at pH of 9.5 or more exhibits better performance (refer to Tests 201 to 204).

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 TiN-containing layer
2 SiON-containing layer
3 SiOC-containing layer
4 Cu-containing layer
5 Via
10, 20 Semiconductor substrate

The invention claimed is:

1. An etching method, comprising the steps of:
preparing an etching liquid comprising water, a basic compound, and an oxidizing agent, the etching liquid being in the range of pH from 8.5 to 14, and
applying the etching liquid onto a TiN-containing layer in a semiconductor substrate thereby etching the TiN-containing layer at an etching rate of 50 to 500 Å/min, the TiN-containing layer having a surface oxygen content from 0.1 mol % to 10 mol %,
wherein the basic compound is a compound represented by formula (I):

N(R)$_4$·OH　　　　　　　　　　　　Formula (I)

wherein R represents a substituent; and a plurality of Rs may be the same or different from each other.

2. The etching method according to claim 1,
wherein the basic compound is tetramethylammonium hydroxide, tetraethylammonium hydroxide, or tetrapropylammonium hydroxide.

3. The etching method according to claim 1,
wherein the oxidizing agent is hydrogen peroxide, ammonium persulfate, perboric acid, peracetic acid, periodic acid, perchloric acid, or a combination thereof.

4. The etching method according to claim 1,
wherein the semiconductor substrate has a first layer of the TiN-containing layer and a second layer containing at least one of Cu, SiO, SiN, SiOC and SiON, and an etching rate ratio of an etching rate (R1) of the first layer to an etching rate (R2) of the second layer (R1/R2) is 30 or more.

5. The etching method according to claim 1,
wherein the surface oxygen content of the TiN-containing layer is obtained by using etching ESCA thereby measuring a concentration profile of Ti, O, and N in the depth direction of 0 to 30 nm from the surface of the TiN-containing layer, in terms of an average of oxygen content at the depth of 5 to 10 nm thereof.

6. The etching method according to claim 1, wherein the etching is conducted at 40° C. or higher.

7. The etching method according to claim 1, wherein the etching is conducted by using single wafer type processing equipment.

8. The etching method according to claim 1, comprising the steps of:
mixing a first liquid and a second liquid, thereby obtaining the etching liquid; the first liquid comprising water and a basic compound, the second liquid comprising water and an oxidizing agent; and
applying the etching liquid onto the semiconductor substrate on a timely basis.

9. The etching method according to claim 1, wherein the etching liquid further comprises a water-soluble organic solvent.

10. A method of producing a semiconductor substrate product, comprising the step of etching the TiN-containing layer of the semiconductor substrate by the etching method according to claim 1.

11. A method of producing a semiconductor device, producing the semiconductor device by using the semiconductor substrate product obtained by the production method according to claim 10.

12. The etching method according to claim 1, wherein the basic compound is tetramethylammonium hydroxide.

13. The etching method according to claim 1, wherein the oxidizing agent is hydrogen peroxide.

14. An etching method, comprising the steps of:
preparing an etching liquid consisting essentially of water, a basic compound, and an oxidizing agent, the etching liquid being in the range of pH from 8.5 to 14,
applying the etching liquid onto a TiN-containing layer in a semiconductor substrate thereby etching the TiN-containing layer, the TiN-containing layer having a surface oxygen content from 0.1 mol % to 10 mol %,
wherein the basic compound is a compound represented by formula (I):

$$N(R)_4 \cdot OH \quad \text{Formula (I)}$$

wherein R represents a substituent; and a plurality of Rs may be the same or different from each other.

15. The etching method according to claim 14,
wherein the basic compound is tetramethylammonium hydroxide, tetraethylammonium hydroxide, or tetrapropylammonium hydroxide.

16. The etching method according to claim 15,
wherein the basic compound is tetramethylammonium hydroxide.

17. The etching method according to claim 14,
wherein the oxidizing agent is hydrogen peroxide, ammonium persulfate, perboric acid, peracetic acid, periodic acid, perchloric acid, or a combination thereof.

18. The etching method according to claim 17,
wherein the oxidizing agent is hydrogen peroxide.

19. The etching method according to claim 14,
wherein the semiconductor substrate has a first layer of the TiN-containing layer and a second layer containing at least one of Cu, SiO, SiN, SiOC and SiON, and an etching rate ratio of an etching rate (R1) of the first layer to an etching rate (R2) of the second layer (R1/R2) is 30 or more.

20. The etching method according to claim 14,
wherein the surface oxygen content of the TiN-containing layer is obtained by using etching ESCA thereby measuring a concentration profile of Ti, O, and N in the depth direction of 0 to 30 nm from the surface of the TiN-containing layer, in terms of an average of oxygen content at the depth of 5 to 10 nm thereof.

21. The etching method according to claim 14, wherein the etching is conducted at 40° C. or higher.

22. The etching method according to claim 14, wherein the etching is conducted by using single wafer type processing equipment.

23. The etching method according to claim 14, comprising the steps of:
mixing a first liquid and a second liquid, thereby obtaining the etching liquid; the first liquid consisting essentially of water and a basic compound, the second liquid consisting essentially of water and an oxidizing agent; and
applying the etching liquid onto the semiconductor substrate on a timely basis.

24. The etching method according to claim 14, wherein the etching liquid further contains a water-soluble organic solvent.

25. A method of producing a semiconductor substrate product, comprising the step of etching a TiN-containing layer of a semiconductor substrate by the etching method according to claim 14.

26. A method of producing a semiconductor device, which comprises fabricating a circuit on the semiconductor substrate product obtained by the production method according to claim 25.

* * * * *